United States Patent
Kuppurao et al.

(10) Patent No.: US 7,709,391 B2
(45) Date of Patent: May 4, 2010

(54) METHODS FOR IN-SITU GENERATION OF REACTIVE ETCH AND GROWTH SPECIE IN FILM FORMATION PROCESSES

(75) Inventors: Satheesh Kuppurao, San Jose, CA (US); David K. Carlson, San Jose, CA (US); Howard Beckford, San Jose, CA (US); Errol Sanchez, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/336,178

(22) Filed: Jan. 20, 2006

(65) Prior Publication Data

US 2007/0170148 A1 Jul. 26, 2007

(51) Int. Cl.
*H01L 21/302* (2006.01)

(52) U.S. Cl. .................... 438/706; 438/714

(58) Field of Classification Search ............ 438/694, 438/706, 712, 714, 719, 723, 724, 725; 427/255
See application file for complete search history.

(56) References Cited

U.S. PATENT DOCUMENTS

| | | | |
|---|---|---|---|
| 4,613,400 A | 9/1986 | Tam et al. | |
| 5,108,792 A | 4/1992 | Anderson et al. | |
| 5,179,677 A | 1/1993 | Anderson | |
| 5,482,739 A * | 1/1996 | Hey et al. | 427/255.39 |
| 5,916,369 A | 6/1999 | Anderson et al. | |
| 6,037,273 A | 3/2000 | Gronet et al. | |
| 6,159,866 A | 12/2000 | Gronet | |
| 6,159,966 A * | 12/2000 | Lohray et al. | 514/224.8 |
| 6,342,421 B1 * | 1/2002 | Mitani et al. | 438/300 |
| 6,900,133 B2 | 5/2005 | Chinn et al. | |
| 6,951,827 B2 * | 10/2005 | Utz et al. | 438/765 |
| 6,972,228 B2 * | 12/2005 | Doyle et al. | 438/256 |
| 7,132,338 B2 | 11/2006 | Samoilov et al. | |
| 7,166,528 B2 | 1/2007 | Kim et al. | |
| 7,262,116 B2 | 8/2007 | Singh et al. | |
| 7,396,743 B2 | 7/2008 | Singh et al. | |
| 7,438,760 B2 | 10/2008 | Bauer et al. | |
| 2004/0216514 A1 * | 11/2004 | Nunnally et al. | 73/40 |
| 2005/0079691 A1 * | 4/2005 | Kim et al. | 438/481 |
| 2005/0277272 A1 | 12/2005 | Singh et al. | |
| 2006/0205194 A1 | 9/2006 | Bauer | |

(Continued)

FOREIGN PATENT DOCUMENTS

WO  WO 2005/038890 A1  4/2005

(Continued)

OTHER PUBLICATIONS

The initiation of a detonation process in H2-Cl2 Mixture, V.A. Levin, et al., Arch. Thermodyn. Spal. (1978) 9(4):613-622.

(Continued)

*Primary Examiner*—Allan Olsen
(74) *Attorney, Agent, or Firm*—Diehl Servilla, LLC (57) ABSTRACT

Methods and apparatus are disclosed for the formation and utilization of metastable specie in a reaction chamber for processing substrates. The metastable specie may be used for etching the surface of substrates in situ, deposition processes during processing of the substrate.

20 Claims, 4 Drawing Sheets

U.S. PATENT DOCUMENTS

2006/0234488 A1 10/2006 Kim et al.
2006/0234504 A1* 10/2006 Bauer et al. ................. 438/674
2009/0026496 A1 1/2009 Bauer et al.

FOREIGN PATENT DOCUMENTS

WO    WO 2005/124838 A1    12/2005
WO    WO 2006/083821 A1    8/2006

OTHER PUBLICATIONS

The H2 + Cl2 Explosion as a Chemical Analogue of the Photoelectric Effect: A True Quantum Mechanical Demonstration, Knox, Ferro, Journal of Chemical Education (1990) 67(10):897.

Photochemical Initiation of Gaseous Detonations, J.H. Lee et al., Acta Astronautica, (1978) 5:971-982.

An FTIR Study of the Kinetics and Mechanism for the Cl- and Br-Atom-Initiated Oxidation of $SiH_4$ Niki, et al. J. Phys. Chem. (1985) 89:1752-1755.

"PCT Search Report", International Application No. PCT/US2007/000338 filed Jan. 9, 2007, (Mar. 2, 2009), 6 pgs.

"PCT Written Opinion", International Application No. PCT/US2007/000338 filed Jan. 9, 2007, (Mar. 2, 2009), 8 pgs.

* cited by examiner

METHODS FOR IN-SITU GENERATION OF REACTIVE ETCH AND GROWTH SPECIE IN FILM FORMATION PROCESSES

TECHNICAL FIELD

Embodiments of the present invention pertain to the formation of reactive etch and growth specie and the modulation of etch and deposition reactions on a substrate.

Films formed on substrates such as semiconductor wafers, including but not limited to Si, SiGe, SiC and SiGeC, in both their doped and undoped forms, are used in the manufacture of advanced electronic components. Such films exhibit various properties, such as morphology and doping concentrations, which must be controlled to within certain tolerances. The advances exhibited in electronics over the past few decades are the result of the ability of semiconductor foundries to increase circuit pattern densities. As these pattern densities increase, the tolerances for the thin films required to make the circuits become increasingly strict. Therefore, careful control of the formation of thin films and the resultant properties of such films are important for continued advances in electronics.

For a variety of thermal film deposition processes performed in reaction chambers, for example, epitaxial (blanket and selective deposition), silicon films (including films doped with germanium, carbon, etc.), polysilicon/amorphous films, and associated dielectric films (e.g., silicon dioxide, silicon nitride, carbon doped silicon glass, silicon carbide etc.), hydrogen-containing gas and silicon-containing precursors are used during deposition or film growth. For selective deposition, film growth occurs simultaneously or alternately with etching, so that a net difference in deposition/growth rate is achieved on various surfaces present on a typical semiconductor wafer. Here, the hydrogen gas and silicon-containing precursors are used along with etch chemicals either in a co-flow mode (certain selective film depositions where deposition and etch gases are simultaneously used, e.g., $SiH_2Cl_2$+$HCl$+$H_2$), or an alternating mode (where deposition occurs in one step (e.g. using $Si_2H_6$+$H_2$) followed by etch (e.g. using $Cl_2$) and these steps could alternate any number of times to reach a desired thickness. In between or after blanket/selective epitaxial or polysilicon or amorphous Si deposition, in-situ chamber cleans present additional instances when etch chemicals are used.

Currently, mostly conventional chemicals are used for etching silicon, for example, HCl, $Cl_2$, HF, HBr, etc. In some processes, the etch chemicals, which are typically oxidizing in nature, and the deposition process gases, which typically contain silicon, hydrogen and a carrier gas (typically hydrogen), cannot be used together, or are "incompatible," except under limited conditions due to safety considerations arising from exothermic spontaneous reactions between these chemicals (e.g. $H_2$+$Cl_2$). Control of reactions between these incompatible chemicals also tends to be difficult. In addition, abatement of some etch chemicals, for example, fluorine, chlorine, bromine, etc., can be challenging with many commercially available systems unable to fully decompose or abate these chemicals.

Selective film deposition processes tend to suffer from poor growth rates at lower temperatures because both deposition and etch chemistries lose their efficiency as temperature drops. Low temperature (e.g., less than about 700° C.) selective chemical vapor deposition requires activated chemical intermediates that are produced and effectively participate in the low temperature simultaneous processes of deposition and etching. Preferred $SiCl_x$ growth species for selective film depositions are not produced from readily available gas precursors (e.g., dichlorosilane, hexachlorodisilane, etc.) at low temperatures. Although mixing $Cl_2$ and hydrogenated silicon gas precursors (e.g., silane and higher order silanes such as disilane, trisilane, pentasilane, etc.) forms $SiCl_x$ intermediates by spontaneous reaction, the intermediates produced by the mixing is typically ineffective for the deposition. While stronger etchants and deposition chemicals can be used as temperature is lowered, reactivity of these chemicals is difficult to control even at reduced temperatures, resulting in vastly different growth and etch attributes.

To achieve selectivity when a more reactive deposition precursor is utilized to enable depositions at lower temperatures, etch and deposition conditions over the entire wafer surface should therefore be accurately modulated. Problems can occur due to over-etching or under-etching that will result in loss of selectivity resulting in subsequent deposition on unwanted areas. Etch reaction is controlled mainly by etchant concentration and temperature, or a combination of both. In many applications, it is less desirable to control etch reactions with temperature, and increasing or decreasing etch species concentration may either result in over-etching, under-etching, or severe wafer-level non-uniformity in addition to negative effects on overall productivity.

Accordingly, it would be desirable to provide processes and apparatus that can safely react strong etch chemicals with hydrogen and silicon-containing gases and to make beneficial use of products of these reactions for film growth and etching. It would also be desirable to provide alternate processes for deposition and etching and controlling such reactions in chambers used for film formation on substrates.

DISCLOSURE OF THE INVENTION

Embodiments of the invention relate to methods of processing a wafer during a film-forming process in a reaction chamber. The methods involve delivering spontaneously reactive chemicals, typically gases, adjacent the wafer surface under conditions to form metastable specie adjacent the wafer surface. The metastable specie can be used for film formation, etching or selective deposition of films.

BEST MODE FOR CARRYING OUT THE INVENTION

Before describing several exemplary embodiments of the invention, it is to be understood that the invention is not limited to the details of construction or process steps set forth in the following description. The invention is capable of other embodiments and of being practiced or being carried out in various ways.

Aspects of the present invention provide methods for forming thin films on a substrate. Other aspects relate to etching at least a portion of a substrate or film on a substrate. One or more embodiments provide strategic injection of spontaneously reactive reactants and reaction of the reactants adjacent to or in close proximity to the silicon wafer at the moment of process conditions such as pressure or temperature appropriate for deposition or etching. Novel processes for forming metastable specie in a reaction chamber are described herein to improve the manufacturing of advanced electronics, such as transistors.

According to one or more embodiments of the invention, reactive etch and growth specie can be formed by controlling the reaction conditions between the etch chemical and either or both hydrogen and silicon-source gases, enabled by key essential designs and appropriate safety interlocks for the apparatus. Examples of safety interlocks include separate injection of the reactants and/or mixing only at a low pressure region of the apparatus. By controlling the reactions and providing such reactor features and interlocks, incompatible chemicals can be combined inside the reaction chamber and put to beneficial use. In certain embodiments, the combination of these chemicals results in the formation of metastable specie that may or may not be more reactive than the molecular versions of the species themselves, but are specifically desired for the growth or etch attributes they effect. These metastable species are short-lived, and by forming these species in the reaction chamber adjacent the wafer surface, they can be utilized as further described herein.

In addition, due to higher reactivity of the environment in the reaction chamber and the intense reaction produced according to one or more embodiments, almost complete conversion of highly oxidizing chemicals to a more benign product of reaction occurs. This, in turn, eases the strict requirements for abatement and results in a process that is more environmentally acceptable.

As will be appreciated by the skilled artisan, according to existing processes, a higher quantity of etch gas and long etch times are typically required during chamber cleans (especially for thermal in-situ chamber cleaning processes) due to the relatively low reactivity of certain molecular forms of etch species used in the process. For example, HCl-based thermal cleaning processes require several standard liters per cleaning event. Present thermal cleaning processes that rely on traditional molecular chemistry require higher temperatures. An alternative is to use much stronger etch chemicals, (e.g., $Cl_2$), however, a drawback of using stronger etch chemicals is reduced lifetime of reactor parts unless the etching power is controlled. According to embodiments of the present invention, in-situ combinations of hydrogen and such strong etch chemicals enables faster but controlled etch processes. Such processes will reduce the use of large amounts of the traditional less-reactive etchants and consequently reduce abatement and environmental issues, while possibly maintaining longer lifetime of reactor parts.

According to one or more embodiments of the present invention, thermal etch and film formation reactions can be modified in-situ by combining the aforementioned etch chemicals along with hydrogen gas and/or silicon-containing gas. As described above, by combining hydrogen and/or silicon-containing gas and the etch chemicals, certain metastable specie are formed that are more desirable than those produced from the separate molecular versions of the species themselves. Using such reactions can provide a great deal of flexibility in dealing with the normal trade-offs associated with deposition of complex films such as selective silicon containing films. For example, certain silicon source chemicals that permit high growth rates at required lower temperatures compromise film attributes such as conformality, morphology, and uniformity. By reacting these silicon-containing gases with etch chemicals in-situ, process windows for simultaneous high growth rate and good film attributes can be obtained.

For purposes of the following disclosure, a film formation process spans the entire period of time, termed the processing period, between the insertion of a substrate into a processing chamber, and the extraction of the substrate from the processing chamber. A single process may incorporate one or more steps; for example, a process may include a pre-clean/surface conditioning step, a film deposition step, and a cool-down step. The invention may be applied, for example, to epitaxial and polysilicon/amorphous film deposition processes, such as Si, SiGe, SiC (carbon doped silicon) and SiGeC (in doped or undoped forms), and may be broadly applied to other processes.

Figure 1:
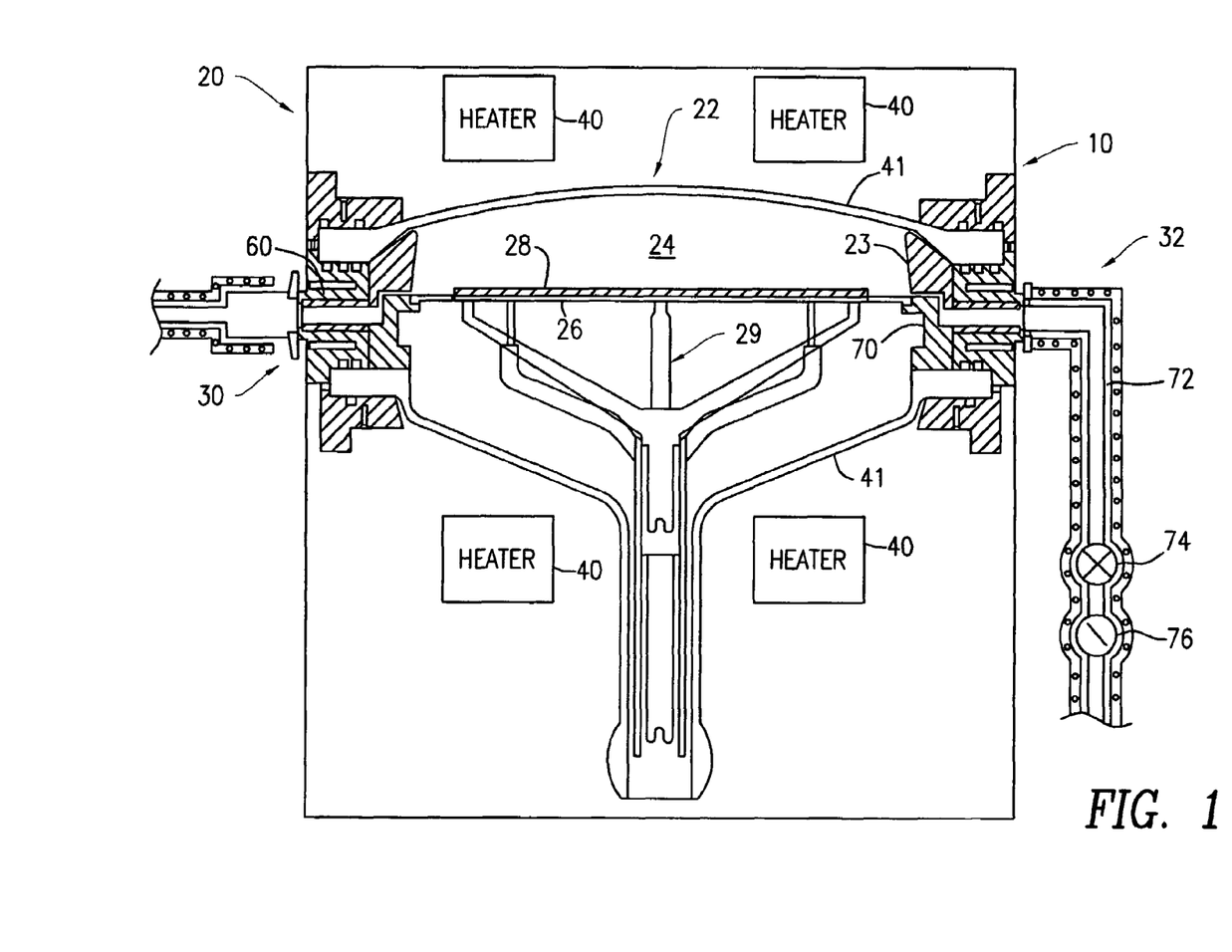
FIG. 1 shows a schematic view of an individual CENTURA® reduced pressure CVD apparatus used in accordance with embodiments of the present invention.

The growth and etch processes described herein can be carried out in a CENTURA® Reduced Pressure CVD System, available from Applied Materials, Inc., of Santa Clara, Calif. The CENTURA® system is a fully automated semiconductor fabrication system, employing a single wafer, multi-chamber, modular design, which accommodates a wide variety of wafer sizes. In addition to the CVD chamber, the multiple chambers may include a pre-clean chamber, wafer orienter chamber, cooldown chamber, and independently operated loadlock chamber. Although the CVD chamber presented herein is shown in schematic in FIG. 1, any of the CVD chambers available in the industry should be able to take advantage of the deposition, growth, modulation and etch chemistries described herein, with some adjustment to other process parameters. The equipment shown in the schematic of FIG. 1 is described in more detail in U.S. Pat. No. 5,108, 792 to Anderson et al., the entire contents of which are incorporated herein by this reference. The apparatus 10 includes a housing 20 that encloses a deposition chamber 22 having a surrounding wall 23 that defines a deposition zone 24. A holder 26 within the deposition chamber 22 can hold a substrate 28 in the deposition zone 24. The holder 26 optionally comprises a drive assembly 29 that is provided for rotating the substrate 28 to enhance the uniformity of the deposited film. An inlet gas conduit 30 provides process gas to the deposition zone 24, and an exhaust gas conduit 32 exhausts process gas byproducts from the deposition zone 24.

A heater 40 in the housing 20 is provided for heating the substrate 28 held by the substrate holder 26. The heater 40 radiantly heats the deposition zone 24 through upper and lower quartz domes 41, and is preferably a symmetrical heater of the type described in U.S. Pat. No. 5,179,677, to Anderson et al., which is incorporated herein by reference.

The gas exhaust conduit 32 preferably comprises an exhaust manifold 70 that connects an exhaust line 72 to the deposition chamber 22. The exhaust line 72 has an isolation valve 74 and a pressure control valve 76 therein.

According to one embodiment of the present invention, incompatible or spontaneously reactive gases (for example, a strong etch gas such as $Cl_2$ and a silicon hydride) are intentionally chosen and isolated from each other and then separately introduced into the reaction chamber to generate active but short-lived chemical intermediates in close proximity to the wafer surface. Isolation of the reactants in separate delivery conduits prevents early formation and deactivation of the chemical intermediates by pre-mature recombination and undesired side reactions. Specific spatial and temporal injection of the reactants into the reactor, which can be performed simultaneously or alternately, initiates the reactions only at the position adjacent or above the wafer. The time and conditions appropriate for particular deposition and etch processes can be controlled as well.

Figure 2A:
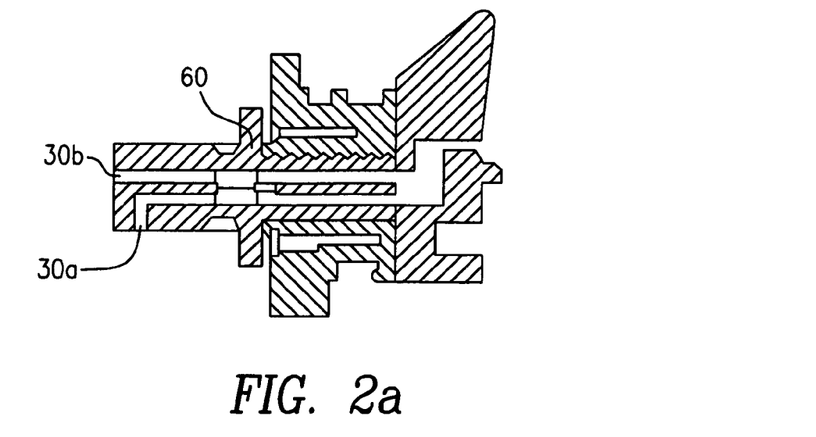
FIGS. 2a-2e show cross-sections of manifolds that can be used with the apparatus of FIG. 1 according to embodiments of the invention.
Figure 2B:
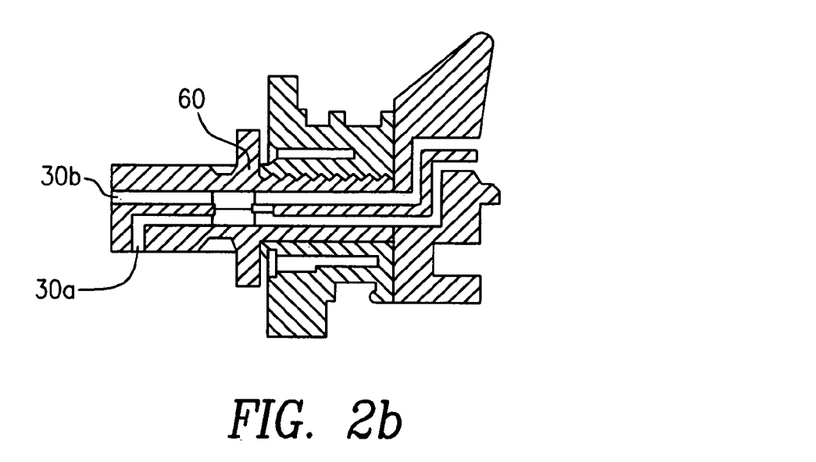
Figure 2C:
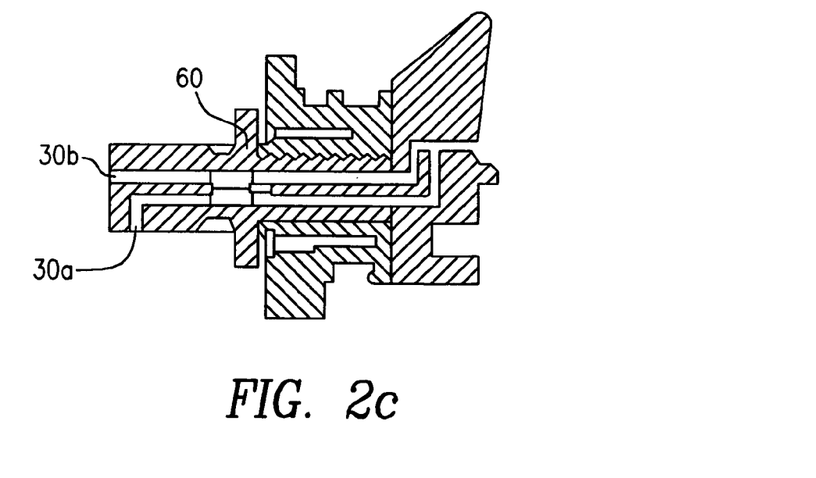
Figure 2D:
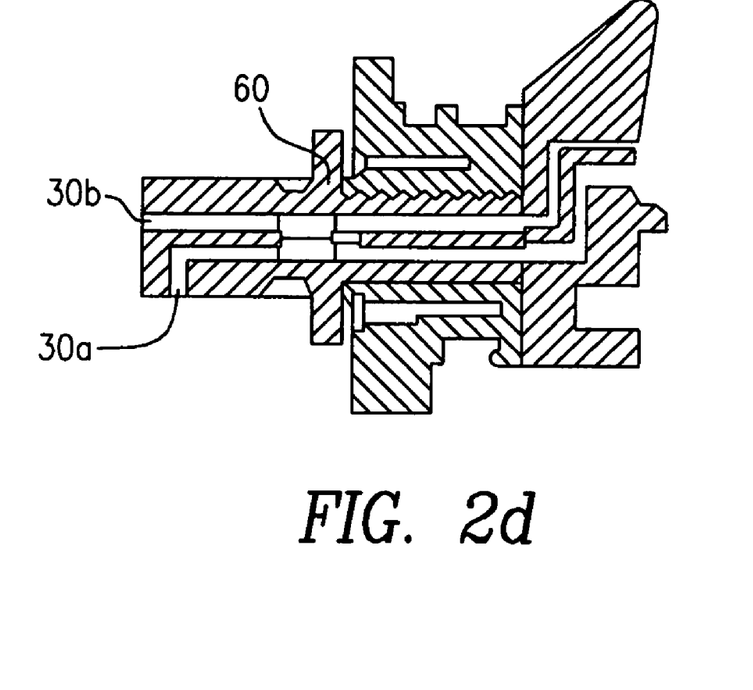
Figure 2E:
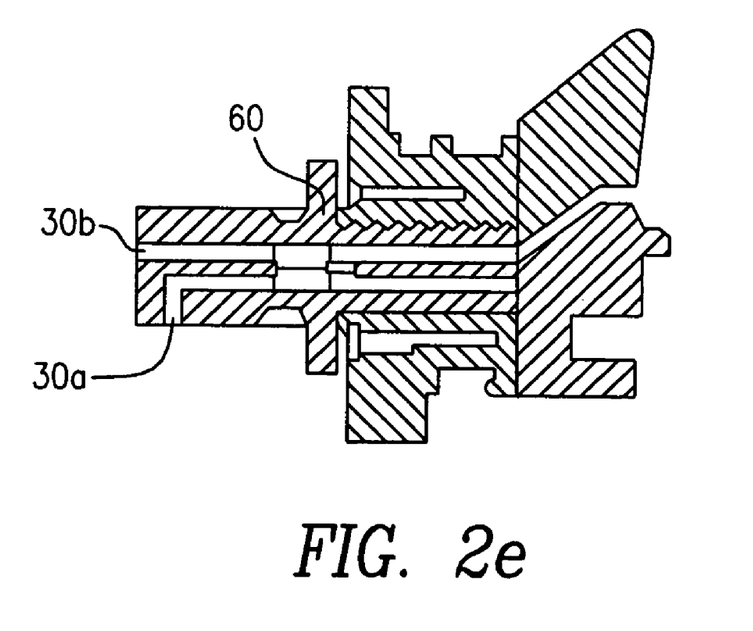

Suitable apparatus for the implementation of the above mentioned embodiments are described in U.S. Pat. Nos. 5,482,739 and 6,159,866, the entire contents of both of which are incorporated herein by reference. Referring now to FIG. 2a, the gas inlet conduit preferably comprises a dedicated etchant gas feed line 30a and a separate hydrogen and silicon containing gas feed line 30b. The feed lines 30a and 30b are joined in an inlet gas manifold 60 which combines the gases adjacent the deposition zone 24. Combining the gases adjacent the deposition zone 24 limits the premature reaction of the incompatible reactive gases. Further non-limiting examples of preferred gas inlets to enable reaction of incompatible gases only at the deposition zone are shown in FIGS. 2b-2e.

Non-limiting examples of known CVD film types and suitable deposition and etch chemistries for selective CVD are listed in Table 1 below. As embodiments of the present invention, some of the deposition and etch chemistries are incompatible but are intentionally chosen to mix but only near the vicinity of the wafer.

TABLE I

| Selective | Deposition and Etch Chemistries | CVD Film |
| --- | --- | --- |
| Epi & Poly SiGe | $H_2$, $N_2$, $SiH_4$, $Si_2H_6$, $Si_3H_8$, $SiH_2Cl_2$, $Si_2Cl_6$, $Si_5H_{12}$, $GeH_4$, $GeCl_4$ | HCl, HBr, $Cl_2$, $NF_3$, $F_2$ |
| Epi & Poly Silicon | $H_2$, $N_2$, $SiH_4$, $Si_2H_6$, $Si_3H_8$, $SiH_2Cl_2$, $Si_2Cl_6$, $Si_5H_{12}$ | HCl, HBr, $Cl_2$, $NF_3$, $F_2$ |
| Epi & Poly SiGe$_x$Cy | $H_2$, $N_2$, $SiH_4$, $Si_2H_6$, $Si_3H_8$, $SiH_2Cl_2$, $Si_2Cl_6$, $Si_5H_{12}$, $GeH_4$, $GeCl_4$, $SiCH_6$, $SiC_3H_{10}$ | HCl, HBr, $Cl_2$, $CH_3Cl$, $CCl_4$, $NF_3$, $F_2$, $CF_4$ |
| Epi & Poly SiC$_x$ | $H_2$, $N_2$, $SiH_4$, $Si_2H_6$, $Si_3H_8$, $SiH_2Cl_2$, $Si_2Cl_6$, $Si_5H_{12}$, $SiCH_6$, $SiC_3H_{10}$ | HCl, HBr, $Cl_2$, $CH_3Cl$, $CCl_4$, $NF_3$, $F_2$, $CF_4$ |

Specifically, embodiments of the invention pertain to methods and apparatus used to combine or react a hydrogen-containing and/or silicon-containing gas with strong oxidizing or etch chemicals such as chlorine, bromine, fluorine, or iodine in a single-wafer lamp-heated thermal reaction chamber, such as those described in FIG. 1. For example, the reaction of $Cl_2 + SiH_4$ produces short-lived $SiCl_x$ and HCl at excited states. Such methods and reaction chambers can be used for a variety of film formation processes, for example for silicon-containing, germanium-containing, or carbon-containing (or combinations thereof) film depositions or in-situ thermal chamber cleaning following such processes. These films can be doped or undoped with either boron, arsenic, phosphorus or other relevant p or n type dopants, which are technologically important for the formation of advanced devices.

In one or more embodiments, a hydrogen-containing gas (either as an independent source gas or as a carrier gas carrying certain precursor compounds) is simultaneously injected into the reaction chamber with molecular etch chemicals (such as $Cl_2$, $F_2$, $Br_2$, or $I_2$) under controlled conditions to form a metastable specie adjacent the wafer surface. A variety of metastable species can be produced that vary greatly in reaction pathways for growth and etching. For example, according to an embodiment of the invention, a hydrogen-containing gas is combined with chlorine adjacent the wafer surface above 200° C. and at reduced pressures (for example, below 200 Torr) and in varying compositions (0% hydrogen to 100% hydrogen with chlorine comprising the rest of the mixture) to form metastable species which could be used for a variety of processes, such as deposition and etching.

The reaction of the hydrogen-containing gas and the etch gas is initiated or catalyzed at low pressures by heating the wafer to a temperature sufficient to cause a reaction to form the metastable specie. Because the heated wafer is used as the initiation source for the reaction, the metastable specie reaction is made to occur only at low pressures and in close proximity to the wafer surface. Reactant gas concentrations and partial pressures are controlled so as to prevent spontaneous and complete reaction within the chamber. By keeping the chamber partial pressure of the reactant gas mixture at less than or equal to a predetermined value during the reaction, any reactant gas concentration may be utilized to form the metastable specie for film growth and etch on the wafer prior to complete undesired recombination.

In embodiments specifically directed to processes involving etching with the metastable species, at least two approaches can be used to modulate etch concentration. According to one embodiment, the relative composition of hydrogen and etch gas, such as chlorine, is adjusted. In another embodiment, the composition can be diluted by injecting additional inert gases, for example, nitrogen or argon, to control the etch process. Additionally, process pressure and flow rates can be changed to allow for further tunability.

Figure 3:
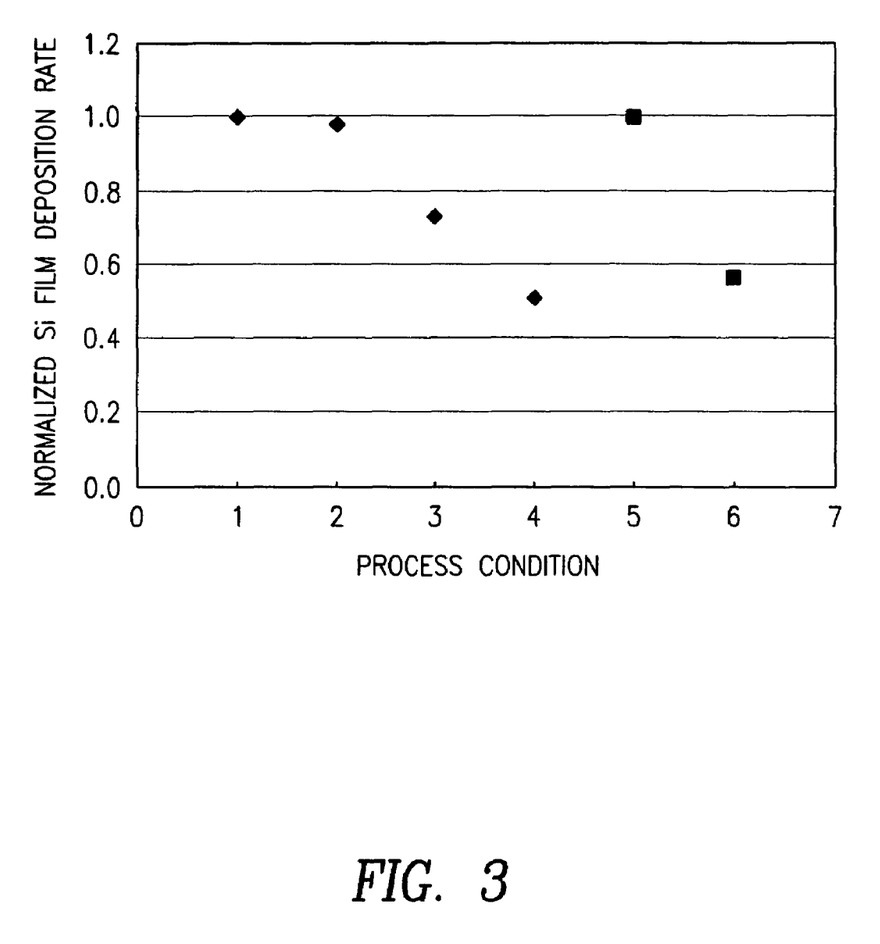

FIG. 3 shows the effect of adjusting the ratio of process gases and the effect on silicon deposition rate. FIG. 3 is a graph of the normalized silicon deposition rate for six different process conditions. Each of the data points in FIG. 3 were generated in an Applied Materials Epi RP Centura® reactor using normal deposition conditions for the deposition of a silicon film, except as specified below for each data point. For each data point, the ratio and/or composition of the process gas was adjusted to determine the effect on deposition rate. For data points 1-4 in FIG. 3, the deposition was conducted using a hydrogen carrier gas at a temperature of about 620° C., a pressure of 10 Torr. The silicon source gas was the same for each data point. For data point 1, the hydrogen to chlorine to silicon flow ratio as 15.4 to 0 to 0.0025. For data point 2, the chlorine and hydrogen gas were introduced adjacent the substrate to etch the film formed using the conditions in data point 1. For data point 2, the flow ratio of hydrogen to chlorine to silicon source gas during etching was 15 to 0.01 to 0. In condition 3, chlorine and nitrogen were used to etch a film formed using process conditions in accordance with data point 1. In data point 3, the hydrogen to chlorine to silicon gas ratio was 0 to 0.01 to 0. In condition 4, chlorine was flowed with the deposition gases flowed in accordance with data point 1. The ratio of hydrogen to chlorine to silicon source gas in data point 4 was 15.4 to 0.01 to 0.0025.

For data points 5 and 6, deposition was conducted in a nitrogen carrier gas at a temperature of 570° C. and a pressure of 10 Torr. For data point 5, a silicon film was deposited flowing hydrogen to chlorine to silicon source gases at a flow ratio of 0.4 to 0 to 0.0025. In data point 6, chlorine was co-flowed with the deposition gases used to generate data point 5 at a flow ratio of hydrogen to chlorine to silicon source gas of 0.4 to 0.015 to 0.0025. Of course, the skilled artisan will readily realize that these data points are merely exemplary and that a wider range of flow ratios, temperatures, pressures and other variants are within the scope of the invention. The data shown in FIG. 3 illustrates the effect of varying the flow ratios of process gases on deposition rate for silicon.

Reactions between otherwise incompatible chemicals can be controlled in a single-wafer lamp-heated thermal reaction chamber, where the interior surface temperature and wafer temperature can be subject to rapid modulation. Such single-wafer reactors where gases are fed into the reactor under cold conditions so that the temperature is not sufficient to crack or decompose the feed gases provide flexibility in that metastable species can be created inside the reactor adjacent to or at the wafer surface. Thus, the metastable specie generation reaction of the present invention is said to be "surface catalyzed" because the heated surface of the wafer is necessary for the reaction to occur, however, it is not consumed in the reaction which forms the metastable specie.

Furthermore, in a rapidly heated reactor that utilizes lamps for heating, the reactions to form the metastable specie can be controlled quickly by ramping up or down the wafer temperature and other heated surfaces in the reactor such as susceptors, liners or domes. This offers a convenient way to modulate the intensity as well as the beginning and end of these reactions. Lamp heating also offers additional energy to modulate these reactions, some of which are photosensitive in addition to thermal energy provided by the lamps. Lamp radiation can be supplied by a wide variety of lamps ranging from ultraviolet (UV or VUV range 100-400 nm wavelength) as well as infra-red lamps. UV radiation offers the additional advantage in that molecular etch chemistries can be decomposed at lower temperatures and with lesser or no hydrogen gas to derive similar benefits.

Although the invention herein has been described with reference to particular embodiments, it is to be understood that these embodiments are merely illustrative of the principles and applications of the present invention. It will be apparent to those skilled in the art that various modifications and variations can be made to the method of the present invention without departing from the spirit and scope of the invention. Thus, it is intended that the present invention include modifications and variations that are within the scope of the appended claims and their equivalents.

What is claimed is:

1. A method of processing a wafer during a film-forming process in a reaction chamber comprising:
   introducing a hydrogen-containing reactant gas into the reaction chamber;
   introducing an etch chemical reactant that is spontaneously reactive with the hydrogen-containing gas in a separate conduit isolated from the hydrogen containing gas into the reaction chamber to provide reactant gas concentrations for the hydrogen containing gas and the etch chemical;
   controlling one or more of the chamber partial pressure, temperature and the reactant gas concentrations below a value to prevent spontaneous reaction of the hydrogen containing gas and the etch chemical;
   changing one or more of the chamber partial pressure, temperature and the reactant gas concentrations to react the hydrogen-containing gas and the etch chemical under controlled reaction conditions to form a metastable specie adjacent a surface of the wafer; and
   utilizing the metastable specie in a subsequent growth or etch reaction.

2. The method of claim 1, wherein the hydrogen-containing gas is in the form of a chemical precursor or a carrier gas.

3. The method of claim 2, wherein the etch chemical is a halide-containing chemical.

4. The method of claim 3, wherein the etch chemical is oxidizing.

5. The method of claim 3, wherein the etch chemical is in molecular form.

6. The method of claim 3, wherein the etch chemical is selected from the group consisting of HCl, HBr, $Cl_2$, $CH_3Cl$, $CCl_4$, $NF_3$, $F_2$, $CF_4$ and combinations thereof.

7. The method of claim 1, further comprising controlling the reaction by modulating the relative amounts of hydrogen and the etchant chemical introduced into the reaction chamber.

8. The method of claim 1, further comprising controlling the reaction by adding a diluent gas to the reaction chamber.

9. The method of claim 8, wherein the diluent gas includes an inert gas.

10. The method of claim 1, wherein the process is a blanket film deposition processes.

11. The method of claim 1, wherein the process is a selective film deposition processes.

12. The method of claim 1, wherein reaction is utilized to improve incorporation of substituted chemical elements into the film.

13. The method of claim 12, wherein the substituted chemical elements include carbon or dopants.

14. The method of claim 1, wherein the method is used to improve the morphology of the film.

15. A method of processing a wafer during a film-forming process in a reaction chamber comprising;
   delivering spontaneously reactive chemicals in separate conduits adjacent the wafer surface to provide reactant concentrations;
   controlling one or more of the chamber partial pressure, temperature and the reactant concentrations below a value to prevent spontaneous reaction of the spontaneously reactive chemicals;
   changing one or more of the chamber partial pressure, temperature and the reactant concentrations to react the chemicals under controlled conditions to form a metastable specie adjacent the wafer surface; and
   utilizing the metastable species in a subsequent reaction.

16. The method of claim 15, further comprising utilizing the metastable specie in an etching process.

17. The method of claim 15, further comprising utilizing the metastable specie in a film growth process.

18. The method of claim 15, wherein the chemicals are selected from the group consisting of $H_2$, $N_2$, $SiH_4$, $Si_2H_6$, $Si_3H_8$, $SiH_2Cl_2$, $Si_2Cl_6$, $Si_5H_{12}$, $GeH_4$, $GeCl_4$, $SiCH_6$, $SiC_3H_{10}$, HCl, HBr, $Cl_2$, $CH_3Cl$, $CCl_4$, $NF_3$, $F_2$, $CF_4$, and combinations thereof.

19. A method of processing a film on a wafer during a film-forming process in a reaction chamber comprising:
   maintaining the temperature of the wafer below about 700° C.;
   isolating $Cl_2$ and silane reactants from each other in separate conduits until the reactants are introduced into the reaction chamber;
   controlling one or more of the chamber partial pressure, temperature and the reactant concentrations below a value to prevent spontaneous reaction of the $Cl_2$ and silane reactants;
   changing one or more of the chamber partial pressure, temperature and the reactant concentration to react the $Cl_2$ and silane adjacent the wafer surface under controlled conditions to form a metastable $SiCl_x$ intermediate adjacent the wafer surface; and
   depositing a film on the wafer surface utilizing the metastable $SiCl_x$ intermediate.

20. The method of claim 19, further comprising isolating excess $Cl_2$ and etching a portion of the wafer.

* * * * *

UNITED STATES PATENT AND TRADEMARK OFFICE
CERTIFICATE OF CORRECTION

PATENT NO. : 7,709,391 B2
APPLICATION NO. : 11/336178
DATED : May 4, 2010
INVENTOR(S) : Satheesh Kuppurao et al.

It is certified that error appears in the above-identified patent and that said Letters Patent is hereby corrected as shown below:

Claim 1, Column 7, lines 33-53 - should read -

1. A method of processing a wafer during a film-forming process in a reaction chamber comprising:
 introducing a hydrogen-containing reactant gas into the reaction chamber;
 introducing an etch chemical reactant that is spontaneously reactive with the hydrogen-containing gas in a separate conduit isolated from the hydrogen containing gas into the reaction chamber to provide reactant gas concentrations for the hydrogen containing gas and the etch chemical;
 preventing spontaneous reaction of the hydrogen containing gas and the etch chemical by controlling one or more reaction conditions;
 modulating one or more of the reaction conditions to react the hydrogen-containing gas and the etch chemical under controlled reaction conditions to form a metastable specie adjacent a surface of the wafer; and
 utilizing the metastable specie in a subsequent growth or etch reaction;
 wherein the one or more of the reaction conditions are selected from the group consisting of partial pressure, temperature, reactant gas concentrations and combinations thereof.

Claim 15, Column 8, lines 20-33 - should read -

15. A method of processing a wafer during a film-forming process in a reaction chamber comprising;
 delivering spontaneously reactive chemicals in separate conduits adjacent the wafer surface to provide reactant concentrations;
 controlling one or more reaction condition to prevent spontaneous reaction of the spontaneously reactive chemicals, the one or more reaction conditions selected from the group consisting of partial pressure, temperature, reactant concentrations and combinations thereof;
 modulating one or more of the reaction conditions to react the chemicals under controlled conditions to form a metastable specie adjacent the wafer surface, the reaction conditions selected from the group consisting of partial pressure, temperature, reactant concentrations and combinations thereof; and Signed and Sealed this Twenty-ninth Day of June, 2010

David J. Kappos
*Director of the United States Patent and Trademark Office* utilizing the metastable species in a subsequent reaction.

Claim 19, Column 8, lines 43-60 - should read -

19. A method of processing a film on a wafer during a film-forming process in a reaction chamber comprising:
    maintaining the temperature of the wafer below about 700° C;
    isolating Cl2 and silane reactants from each other in separate conduits until the reactants are introduced into the reaction chamber;
    controlling one or more reaction conditions to prevent spontaneous reaction of the Cl2 and silane reactants;
    modulating one or more of the reaction conditions to react the Cl2 and silane adjacent the wafer surface under controlled conditions to form a metastable SiClx intermediate adjacent the wafer surface; and
    depositing a film on the wafer surface utilizing the metastable SiClx intermediate.

Claim 20, Column 8, lines 61-62 - should read -

20. The method of claim 19, wherein the one or more of the reaction conditions are selected from the group consisting of chamber partial pressure, temperature, reactant concentration and combinations thereof.